US010288870B2

(12) United States Patent
Kamal et al.

(10) Patent No.: US 10,288,870 B2
(45) Date of Patent: May 14, 2019

(54) WAVELENGTH TUNABLE MEMS-FABRY PEROT FILTER

(71) Applicant: InPhenix, Inc., Livermore, CA (US)

(72) Inventors: Mohammad Kamal, Livermore, CA (US); Tongning Li, Fremont, CA (US); David Eu, Fremont, CA (US); Qinian Qi, Fremont, CA (US)

(73) Assignee: INPHENIX, INC, Livermore, CA (US)

( * ) Notice: Subject to any disclaimer, the term of this patent is extended or adjusted under 35 U.S.C. 154(b) by 11 days.

(21) Appl. No.: 15/583,355

(22) Filed: May 1, 2017

(65) Prior Publication Data

US 2017/0235124 A1    Aug. 17, 2017

Related U.S. Application Data

(62) Division of application No. 14/553,807, filed on Nov. 25, 2014, now Pat. No. 9,638,913.

(Continued)

(51) Int. Cl.
*G02B 26/00*    (2006.01)
*H01L 39/24*    (2006.01)
(Continued)

(52) U.S. Cl.
CPC ........ *G02B 26/001* (2013.01); *B81C 1/00317* (2013.01); *G02B 1/11* (2013.01);
(Continued)

(58) Field of Classification Search
CPC .......... G02B 26/001; G02B 1/12; G02B 1/11; H01L 39/2467; H01L 33/46;
(Continued)

(56) References Cited

U.S. PATENT DOCUMENTS 6,339,603 B1 * 1/2002 Flanders ............... H01S 5/141
372/20
6,373,632 B1 * 4/2002 Flanders ............... G01J 3/26
359/291
(Continued)

FOREIGN PATENT DOCUMENTS

WO    2012-168545 A1    12/2012

OTHER PUBLICATIONS

Yano, T., et al. "Wavelength Modulation Over 500 kHz of Micromechanically Tunable InP-Based VCSELs With SI-MEMS Technology", IEEE Journal of Selected Topics in Quantum Electronics, vol. 15, No. 3, pp. 528-534, May/Jun. 2009.

(Continued)

*Primary Examiner* — Yuanda Zhang
(74) *Attorney, Agent, or Firm* — McDermott Will & Emery, LLP

(57) ABSTRACT

A wavelength tunable gain medium with the use of micro-electromechanical system (MEMS) based Fabry-Perot (FP) filter cavity tuning is provided as a tunable laser. The system comprises a laser cavity and a filter cavity for wavelength selection. The laser cavity consists of a gain medium such as a Semiconductor Optical Amplifier (SOA), two collimating lenses and an end reflector. The MEMS-FP filter cavity comprises a fixed reflector and a moveable reflector, controllable by electrostatic force. By moving the MEMS reflector, the wavelength can be tuned by changing the FP filter cavity length. The MEMS FP filter cavity displacement can be tuned discretely with a step voltage, or continuously by using a continuous driving voltage. The driving frequency for continuous tuning can be a resonance frequency or any other frequency of the MEMS structure, and the tuning range can cover different tuning ranges such as 30 nm, 40 nm, and more than 100 nm.

4 Claims, 8 Drawing Sheets

Related U.S. Application Data

(60) Provisional application No. 61/909,277, filed on Nov. 26, 2013.

(51) Int. Cl.

| | | |
|---|---|---|
| *H01S 3/08* | (2006.01) | |
| *H01S 3/105* | (2006.01) | |
| *H01S 5/14* | (2006.01) | |
| *H01S 3/106* | (2006.01) | |
| *B81C 1/00* | (2006.01) | |
| *G02B 1/11* | (2015.01) | |
| *G02B 1/12* | (2006.01) | |
| *H01L 33/46* | (2010.01) | |
| *H01S 5/183* | (2006.01) | |
| *H01S 3/083* | (2006.01) | |

(52) U.S. Cl.
CPC ............... *G02B 1/12* (2013.01); *H01L 33/46* (2013.01); *H01L 39/2467* (2013.01); *H01S 3/08027* (2013.01); *H01S 3/105* (2013.01); *H01S 3/1062* (2013.01); *H01S 5/141* (2013.01); *H01S 5/18366* (2013.01); *B81C 2201/013* (2013.01); *H01L 2924/1461* (2013.01); *H01S 3/083* (2013.01)

(58) Field of Classification Search
CPC ......... H01L 2924/1461; H01S 5/18366; H01S 3/105; H01S 3/08027; B81C 1/00317; B81C 2201/013

See application file for complete search history.

(56) References Cited

U.S. PATENT DOCUMENTS

| | | | | |
|---|---|---|---|---|
| 6,618,414 B1* | 9/2003 | Wasserbauer | ....... | H01S 5/18358 372/45.01 |
| 7,483,211 B2* | 1/2009 | Nakamura | ........... | G02B 26/001 359/579 |
| 7,701,588 B2* | 4/2010 | Chong | ................. | A61B 5/0066 356/497 |
| 8,059,690 B2 | 11/2011 | Chang-Hasnain | | |
| 9,638,913 B2 | 5/2017 | Kamal | | |
| 2002/0176474 A1* | 11/2002 | Huang | ................... | B82Y 10/00 372/96 |
| 2003/0011864 A1* | 1/2003 | Flanders | ............... | B81B 3/0035 359/230 |
| 2003/0016709 A1* | 1/2003 | Flanders | ................. | H01S 5/141 372/26 |
| 2003/0156846 A1 | 8/2003 | Ford | | |
| 2006/0118721 A1 | 6/2006 | Jarek | | |
| 2007/0183643 A1* | 8/2007 | Jayaraman | ............. | A61B 3/102 382/131 |
| 2007/0189348 A1* | 8/2007 | Kovsh | ................... | B82Y 20/00 372/45.01 |
| 2008/0212633 A1* | 9/2008 | Shimizu | ................ | B82Y 20/00 372/45.011 |
| 2009/0303487 A1* | 12/2009 | Bond | .................... | G01N 21/39 356/437 |
| 2010/0316083 A1* | 12/2010 | Chang-Hasnain | ... | G02B 5/0816 372/50.11 |
| 2014/0028997 A1* | 1/2014 | Cable | ................. | G01B 9/02091 356/51 |
| 2014/0268169 A1* | 9/2014 | Jayaraman | .......... | H01S 5/18366 356/479 |
| 2015/0010031 A1* | 1/2015 | Makino | ............... | H01S 5/18311 372/45.01 |

OTHER PUBLICATIONS

Nishiyama, N., et al. "Long-Wavelength Vertical-Cavity Surface-Emitting Lasers on InP With Lattice Matched AlGaInAs—InP DBR Grown by MOCVD", IEEE Journal of Selected Topics in Quantum Electronics, vol. 11, No. 5, pp. 990-998, Sep./Oct. 2005.

Peng, P.-C., et al., "Dynamic Characteristics and Linewidth Enhancement Factor of Quantum-Dot Vertical-Cavity Surface-Emitting Lasers", IEEE Journal of Selected Topics in Quantum Electronics, vol. 15, No. 3, pp. 844-849, May/Jun. 2009.

Jayaraman, V., et al., "OCT imaging up to 760 kHz axial scan rate using single-mode 1310 nm MEMS-tunable VCSEL with >100 nm tuning range", Optical Society of America / CLEO: 2011 — Laser Science to Photonic Applications, PDPB2, 2011,.

Takada, K., et al., "10.3-Gb/s Operation over a Wide Temperature Range in 1.3µm Quantum-dot DFB Lasers with High Modal Gain", Optical Society of America / Optical Fiber Communication Conference\ National Fiber Optic Engineers Conference, Technical Digest (2010).

Cole, G. D., et al., "Fabrication of suspended dielectric mirror structures via xenon difluoride etching of an amorphous germanium sacrificial layer", J. Vac. Sci. Technol. B 26(2), p. 593, Mar/Apr 2008.

Chen, S. et al., "Hybrid Quantum Well/Quantum Dot Structure for Broad Spectral Bandwidth Emitters", IEEE Journal of Selected Topics in Quantum Electronics, Vol. 19, No. 4, 1900209, Jul./Aug. 2013.

International Search Report and Written Opinion in PCT/US2014/045170, dated Nov. 3, 2014.

International Search Report and Written Opinion in PCT/US2014/067477, dated Feb. 20, 2015.

Marschall, S., et al., "Fourier domain mode-locked swept source at 1050 nm based on a tapered amplifier", Optics Express, 2010, Jul. 12, vol. 18, No. 15, pp. 15820-15831.

Non-final Office Action dated Oct. 30, 2014, in U.S. Appl. No. 14/321,792.

Supplementary European Search Report and European Search Opinion from European Patent Application No.:EP14866509 Search Completed Jun. 2, 2017, 9 pages (2017).

Office Action dated Mar. 20, 2018 in Chinese Application serial no. 2014800702213.

* cited by examiner

WAVELENGTH TUNABLE MEMS-FABRY PEROT FILTER

CLAIM OF PRIORITY

This application is a divisional of U.S. application Ser. No. 14/553,807, now U.S. Pat. No. 9,638,913, which claims the benefit of priority under 35 U.S.C. §119(e) to U.S. provisional application Ser. No. 61/909,277, filed Nov. 26, 2013, both of which are incorporated herein by reference in their entirety.

TECHNICAL FIELD

The technology described herein generally relates to Fabry-Perot filters for use in tunable laser sources, and more particularly relates to Fabry-Perot filters that comprise MEMS devices.

BACKGROUND

Fabry-Perot (FP) filters have been widely used in tunable laser sources, including those with external cavities and ring cavities. In such lasers, the filter cavity is external to the laser cavity. The FP filter uses a classical wavelength tunable method, well known to one skilled in the art, so it is only briefly described here. A detailed description can be found in, for instance, K. K. Sharma, "OPTICS: Principles and Applications", Academic Press; $1^{st}$ edition (Aug. 30, 2006), which is incorporated herein by reference. The optical cavity of a tunable FP filter comprises two reflectors, a fixed reflector and a moveable reflector, separated by an air gap. Distributed Bragg reflector (DBR) mirrors, made from dielectric materials, are typically used as cavity reflectors because they provide high reflectivity.

The three critical parameters of an FP filter are its free spectral range (FSR), cavity finesse, and cavity filter bandwidth, but all of these depend on the effective optical cavity length and effective reflectivity. The effective optical cavity length of the FP filter needs to be used in order to more accurately calculate the filter parameters. This length includes the optical distance between the cavity reflectors and the optical penetration depth into the dielectric DBR mirrors. Optical distance is defined as the product of the physical (geometric) distance travelled by the light multiplied by the refractive index of the medium/media through which it propagates.

In a FP filter, the wavelengths of maximum transmission occur periodically, and the spacing between adjacent maxima (the mode spacing) is called the free spectral range, denoted by the symbol $\Delta\lambda_{FSR}$. The FSR of a FP filter, for a given design wavelength $\lambda$, is determined by the effective optical distance between the cavity reflectors, $L_{eff}$, i.e., the effective optical cavity length, expressed as:

$$\left(\Delta\lambda_{FSR} = \frac{\lambda^2}{2L_{eff}}\right). \quad (1)$$

In particular, this defining relationship shows that the FSR is inversely proportional to the optical cavity length: thus, a shorter cavity provides a broader FSR.

The finesse of a FP filter is determined by the effective reflectivity, $r_{eff}$, of the FP cavity, as follows:

$$\left(F_{FP} = \frac{\pi\sqrt{r_{eff}}}{1 - r_{eff}}\right).$$

The cavity reflectivity $r_{eff}$ is, in turn, determined by the reflectivity of the two reflectors. The reflectivity lies in the range $0 < r_{eff} < 1$.

The ratio of the FSR of a FP filter to its bandwidth is its finesse, $F_{FP}$. This quantity is akin to a quality factor ("Q factor") for the device. Therefore, narrowing the filter bandwidth for a constant FSR, leads to an increased finesse.

The filter bandwidth, $\delta\lambda_{FP}$, of a FP filter is the sharpness of each transmission peak. The bandwidth is determined by the reflectivity (and loss) of the interferometer plates as well as the plate spacing. It is also the ratio of the free spectral range (FSR) and the finesse (F), and is given by:

$$\delta\lambda_{FP} = \frac{\Delta\lambda_{FSR,FP}}{F_{FP}} = \frac{\lambda^2}{2L_{eff}} \frac{1 - r_{eff}}{\pi\sqrt{r_{eff}}} \quad (2)$$

where $\lambda$ is the design wavelength, and $L_{eff}$ is the effective optical cavity length of the FP cavity. The filter bandwidth is also its minimum resolvable bandwidth (i.e., its resolution). A narrow filter bandwidth is desirable for high optical transmission, low insertion loss, and low wavefront distortion. It can be seen that the key requirements to achieve a narrow filter bandwidth are: (1) a longer effective optical cavity length; and (2) higher reflectivity of the FP cavity reflectors.

A FP tunable filter can be tuned to selected wavelengths by changing the filter cavity length. The wavelength tuning range, $\Delta\lambda$, of a FP filter is given by:

$$\Delta\lambda = \lambda \frac{\Delta L}{L_{eff}} \quad (3)$$

where $\Delta L$ is the change in cavity length of the FP cavity. The wavelength tuning range is typically smaller than the FSR for the FP filter. To achieve a wide wavelength tuning range (for example of 100 nm or more), the effective optical cavity length should be in the range of a few microns.

Micro-electro-mechanical-system (MEMS) technology has been used to change the filter cavity length (and hence the effective optical cavity length) of an FP filter to enable wavelength tuning. For example, one such tunable Fabry-Perot filter that uses a MEMS is disclosed in U.S. Pat. No. 6,373,632 B1, issued Apr. 16, 2002 to Flanders for "Tunable Fabry-Perot Filter", which is herein incorporated by reference.

In this patent, two reflectors that define the FP cavity are situated on two separate wafers that are then bonded together. Ensuring that the mirrors are parallel to one another after this process is important. Motion comes from moving a membrane on one side of the FP cavity. There is one cavity for the filter; and another adjacent cavity defined by the MEMS. Although bonding two chips gives flexibility to configure the filter optical cavity length for a desired bandwidth and FSR, bonding two chips adds to the fabrication complexity and manufacturing cost.

SUMMARY

The present invention comprises a FP filter that utilizes a MEMS, and in which the MEMS cavity is part of the FP filter cavity. Such a configuration is efficient from the point of view of fabrication, as well as compact in design.

The present invention involves using a sequence of semiconductor fabrication processes to manufacture a MEMS-FP filter, instead of carrying out an expensive and more complicated bonding of separate components, as has previously been described. By creating a device that has just one cavity that includes the MEMS (electrostatic) and optical functions (instead of separate cavities), a bonding step is avoided. Furthermore, the air gap that is part of the FP filter can be etched out during the process of fabrication.

In addition, the MEMS-FP filter of the present invention can be tuned discretely or continuously. The filter can cover various design wavelength windows, from 100-3000 nm, and preferably from 600-1800 nm, including: 600-699 nm, 700-799 nm, 800-899 nm, 900-999 nm, 1000-1099 nm, 1100-1199 nm, 1200-1299 nm, 1300-1399 nm, 1400-1499 nm, 1500-1599 nm, 1600-1699 nm, 1700-1800 nm. Preferred design wavelengths include, for example, 850 nm, 1060 nm, 1300 nm, 1550 nm, and 1750 nm.

The design and configuration of an FP filter is driven by the combination of wanting to achieve narrow filter bandwidth and broad FSR, leading to higher finesse. Maximizing these two parameters concurrently is difficult, however. In practice, the two parameters are limited by the filter cavity length, mirror reflectivity, and aspects of construction such as mirror alignment and bonding. Therefore, it is important to configure the filter cavity in such a way that it can provide the desired filter bandwidth and FSR.

In the present invention the optical cavity of the FP filter is formed by a fixed reflector on the back side of the wafer substrate, a part of the wafer substrate that is left after a cut-out has been etched from the substrate, an anti-reflective coating on the top side of the substrate, an air gap and a moveable reflector. The top side of the wafer substrate and the moving reflector function as the MEMS electrodes. Therefore, the MEMS electrostatic cavity overlaps in space with, and is a part of, the filter optical cavity. Thus, the design approach of this invention eliminates the need to bond two separate MEMS chips to form a separate MEMS cavity and a FP filter cavity. The MEMS-FP filter of the present invention is an integrated device, so that no alignment is required to form the filter optical cavity and MEMS electrostatic cavity. The length of the filter optical cavity can be configured by adjusting the thickness of the part of the substrate that forms the filter cavity. Therefore, the filter optical cavity is configurable without altering the MEMS electrostatic cavity. In addition, either high reflective metal coating or multilayer dielectric DBR mirrors can be used to achieve high reflectivity from both of the cavity reflectors. As a result, this invention provides a design with improved flexibility to configure the FP filter optical cavity length and reflectivity to achieve a desired filter bandwidth and FSR. In some embodiments, the moveable reflector is made up of a dielectric MEMS structure, and in others it is a MEMS structure with multilayer DBR mirrors thereon.

In one embodiment, the invention includes a tunable MEMS-FP filter that comprises, a semiconductor or dielectric substrate having an upper and a lower face; a fixed reflector attached to the lower face of the substrate, a bottom electrode disposed on the upper face of the substrate, and an AR layer disposed on the upper face of the substrate; a moveable reflector having an upper and a lower face, supported by one or more suspension beams, and comprising a MEMS structure and multilayer dielectric DBR mirrors and a top electrode disposed on the upper face of the moveable reflector, wherein an air gap is formed between the lower face of the moveable reflector and the upper face of the substrate; wherein an optical cavity is formed between the fixed reflector and the moveable reflector. The device operates by configuring a voltage source to supply voltage between the top electrode and the bottom electrode to change the cavity length of the optical cavity.

In another embodiment, a tunable MEMS-FP filter, comprises: a semiconductor or dielectric substrate having an upper and a lower face; a fixed reflector attached to the lower face of the substrate, a bottom electrode disposed on the upper face of the substrate, and an AR layer disposed on the upper face of the substrate; a moveable reflector having an upper and a lower face, supported by one or more suspension beams, and comprising multilayer dielectric DBR mirrors and a top electrode disposed on the upper face, wherein an air gap is formed between the lower face of the moveable reflector and the upper face of the substrate; wherein an optical cavity is formed between the fixed reflector and the moveable reflector; and a voltage source to supply voltage between the top electrode and the bottom electrode to change the cavity length of an the optical cavity.

The invention further comprises a method of fabricating a MEMS-FP filter, one such method comprising, for an exemplary embodiment of filter: etching a cut-out from a lower surface of a substrate; depositing one or more multilayer dielectric DBR mirrors on to the surface of the cut-out; depositing an anti-reflective coating layer on to the upper surface of the substrate; patterning and etching the anti-reflective coating layer; depositing a bottom electrode onto the upper face of the substrate; patterning and etching the bottom electrode; depositing a sacrificial layer, MEMS structure, and top electrode on top of the patterned anti-reflective coating and the bottom electrode; patterning and etching the top electrode; depositing one or more multilayer dielectric DBR mirrors on to the MEMS structure and the top electrode; patterning and etching the multilayer dielectric DBR mirrors on the MEMS structure; and selectively etching the MEMS structure and the sacrificial layer to create an air gap and a support frame that connects the substrate to the MEMS structure.

BRIEF DESCRIPTION OF THE DRAWINGS

Like reference symbols in the various drawings indicate like elements.

DETAILED DESCRIPTION

Figure 1A:
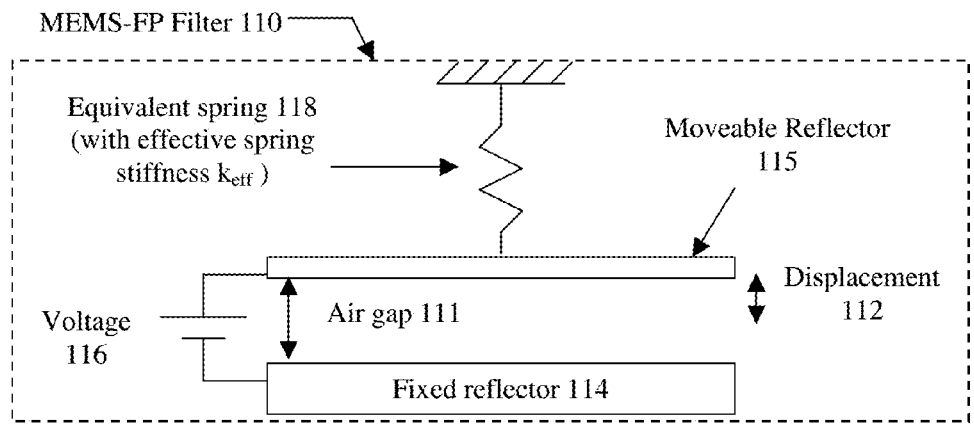
FIG. 1A is a schematic representation of an electrostatically actuated MEMS system configuration.

The various embodiments of the present invention in the descriptions herein show different configurations of MEMS-FP filter cavity reflectors that increase the effective optical cavity length and enhance the effective reflectivity. The tunable MEMS-FP filter of the present invention can be incorporated into either a free space integrated tunable laser source or into a fiber coupled tunable laser source.

Parallel plate electrostatic actuation is commonly used in MEMS devices. The parallel plate actuator is a capacitor with one of the plates suspended by a support structure so that it is able to move when a driving voltage V is applied between the parallel plates. The voltage displacement relationship is given by:

$$V = \sqrt{\frac{2K_{eff}\Delta L(L_{air}-\Delta L)^2}{\varepsilon A}} \quad (4)$$

where V is the driving voltage, $L_{air}$ is the length of the air gap between two plates, A is the area of the plate, $\varepsilon_0$ is the permittivity of a vacuum, $k_{eff}$ is the effective spring constant of the MEMS structure, and $\Delta L$ is the displacement of the moving MEMS plate.

Thus, if the MEMS cavity is part of an FP optical cavity, the wavelength can be tuned discretely because the filter cavity length changes incrementally when stepping the voltage.

The wavelength can also be tuned continuously (rather than discretely) by driving the MEMS structure dynamically at any driving frequency, in particular its resonance frequency. The resonance frequency, f, of the MEMS structure is given by:

$$f = \frac{1}{2\pi}\sqrt{\frac{k_{eff}}{m_{eff}}} \quad (5)$$

where $m_{eff}$ is the effective mass of the MEMS structure.

A longer effective optical cavity requires greater distances between the MEMS electrodes that then require higher driving voltages to displace the moving MEMS structure.

In the present invention, for a given design wavelength, the filter cavity length is configurable to achieve the desired FP filter FSR, and hence the desired wavelength tuning range. The FSR of the MEMS-FP filter can cover at least 50 nm and preferably FSR is 100 nm or more. The wavelength tuning range can be equal to or smaller than the FP filter FSR. Therefore, the wavelength tuning range can cover 50 nm and preferable tuning range is 100 nm or more. The effective optical cavity length can be calculated from Equation (1) for a desired FSR and a chosen design wavelength. For example, for a desired FP filter FSR of 150 nm and design wavelength of 1300 nm, the effective optical cavity length should be 5.63 μm. The present invention is not limited to this example. The effective optical cavity length can be designed for any desired FP filter FSR and a chosen design wavelength.

Higher effective reflectivity is required to achieve a narrow filter bandwidth in the FP filter. There are many ways to achieve high reflectivity including using high reflective metallic coating reflector and distributed Bragg reflector (DBR) mirrors. The DBR mirrors consist of alternating layers of quarter-wave thick high and low refractive index dielectric materials. A quarter-wave layer is a layer with optical thickness $n_i t_i$ ($n_i$ being the refractive index of the ith layer and $t_i$ its thickness) which satisfies the expression: $n_i t_i = \lambda/4$, where $\lambda$ is the design wavelength of the FP filter. Typically, a DBR comprises up to 20 layers.

In the present invention (see FIG. 1), the reflectivities of both fixed reflector 114 and moveable reflector 115 are configurable for maximizing the effective reflectivity of the MEMS-FP filter. MEMS-FP filter cavity reflectors can be configured to achieve a cavity reflectivity of more than 0.9895, more than 0.9975, and more than 0.9997, thereby providing filter bandwidths narrower (i.e., better) than 0.1 nm, narrower than 0.025 nm and narrower than 0.003 nm respectively, depending on the effective optical cavity length and the design wavelength.

FIG. 1A shows a schematic of the basic features of a MEMS-FP filter 110 according to the present invention. In this schematic, moveable reflector 115 is supported by one or more suspension beams. In FIG. 1A, the suspension beams are represented by an equivalent spring 118 with an effective spring stiffness $k_{eff}$. The distance between the fixed reflector 114 and moving reflector 115 is filled by the air gap 111. Application of a voltage from voltage source 116 gives rise to an electrostatic force between the two reflectors which causes a movement of moveable reflector 115 shown as displacement distance 112.

Figure 1B:
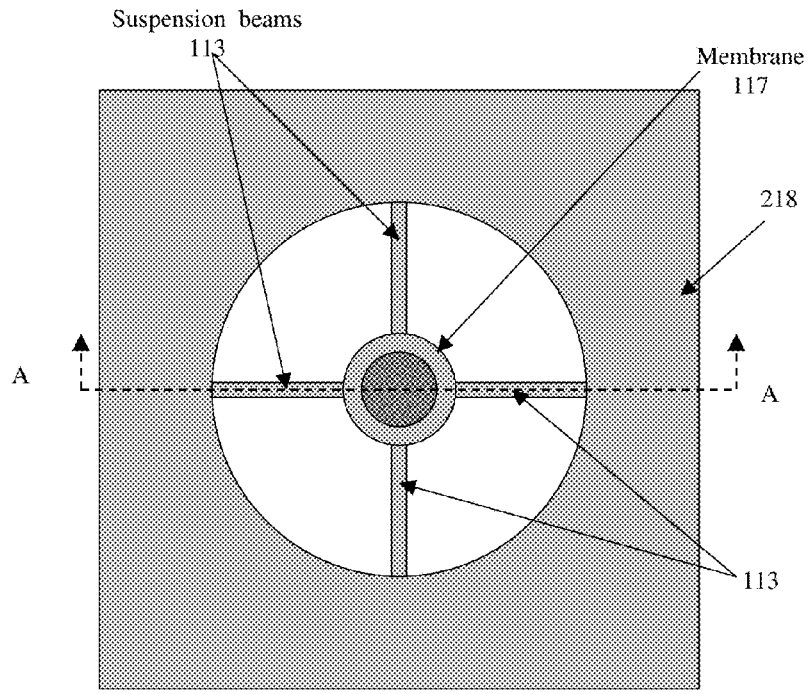
FIG. 1B is a top view of the moveable reflector of MEMS-FP filter system.

FIG. 1B shows a schematic top view of moveable reflector 115. The moveable reflector 115 comprises of MEMS membrane 117, suspension beams 113 and support fame 218. A movable MEMS membrane 117 is suspended by using suspension beams 113 with a support frame 218. For tunable FP filter the MEMS membrane 117 diameter is typically 200 μm to 500 μm. The MEMS driving voltage 116 depends on the MEMS geometric layout, the materials, the air gap 111, and the target displacement 112. The driving voltage 116 is typically in a range of from 50V to 500V.

In the embodiments of FIGS. 2A, 2B, 3A, 3B, the lower surface of a substrate 212 has been etched to create a cut-out in which a fixed reflector is disposed. The cut-out is needed because the wafer or substrate is typically too thick to function as part of the filter cavity of a FP filter. By etching out a cut-out, the desired effective optical cavity length can be achieved for the desired FSR.

Figure 2A:
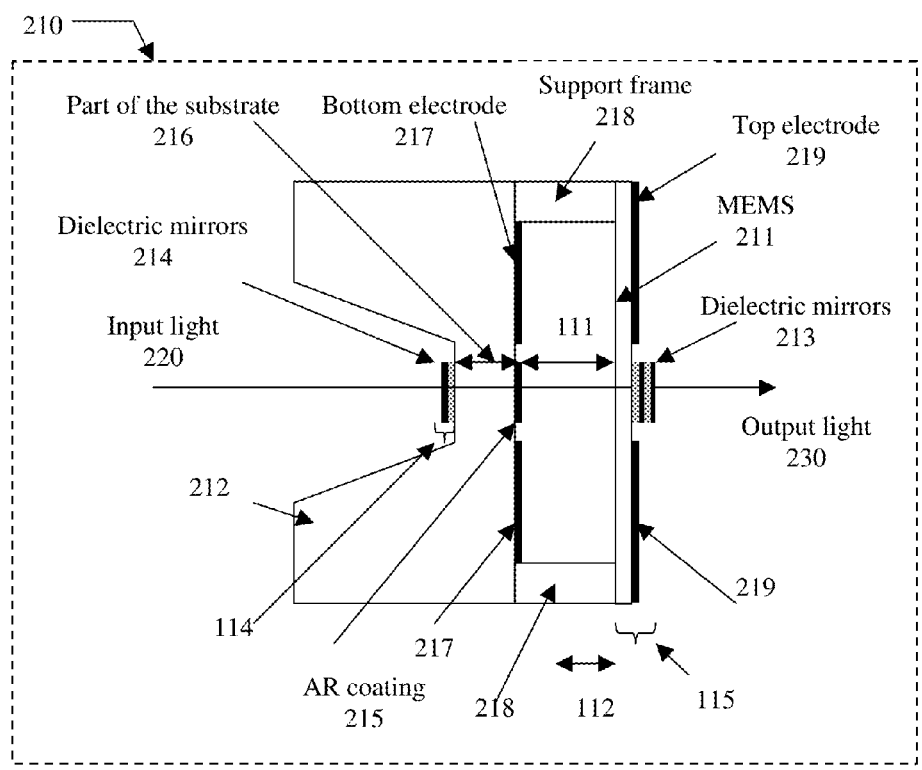
FIGS. 2A and 2B are schematic representations of dielectric mirror based MEMS-FP filters according to two exemplary embodiments of the present invention.

FIG. 2A shows a cross section (along the A-A line of FIG. 1B) of one embodiment of a MEMS-FP filter 210. In this embodiment, the fixed reflector 114 comprises multilayer dielectric DBR mirrors 214. The moveable reflector 115 comprises a MEMS structure 211 and multilayer dielectric DBR mirrors 213. The MEMS structure 211 can be made of Si, $SiN_x$ or any dielectric material. Moveable reflector 115 is attached to the substrate via support frame 218, which act as suspension beams at the edges, and allow MEMS structure 211 to be moved. The air gap 111 is thus enclosed between support frame 218 and the two reflectors. The MEMS electrodes 217 and 219 are deposited on to substrate 212 and moveable reflector 115 respectively, and are both connected to a voltage source (not shown).

The optical cavity length of MEMS-FP filter 210 is comprised of the optical penetration depth of input light 220 into fixed reflector 114, the thickness 216 of part of the substrate 212, the thickness of anti-reflective (AR) coating layer 215, the length of air gap 111, the thickness of MEMS structure 211 and the optical penetration depth of light into the reflector 213. In this embodiment, the optical cavity length, $L_{eff}$, of the MEMS-FP is therefore given by:

$$L_{eff} = L_{pen,fixed} + n_{sub}L_{sub} + n_{AR}L_{AR} + L_{air} + n_{MEMS}L_{MEMS} + L_{pen,moveable} \quad (6)$$

where $L_{pen,fixed}$ is the optical penetration depth of light into the reflector 114, $L_{sub}$ is the substrate thickness 216 along the optical path of the FP cavity, $n_{sub}$ is the refractive index of the substrate material, $L_{AR}$ is the anti-reflection (AR) coating layer 215 thickness, $n_{AR}$ is the refractive index of the AR coating material, $L_{air}$ is the MEMS air gap 111, $L_{MEMS}$ is the MEMS structure 211 thickness, $n_{MEMS}$ is the refractive index of the MEMS structure material, and $L_{pen,moveable}$ is the optical penetration depth of light into the reflector 213.

An input ray of light 220 travels into the MEMS-FP filter cavity through fixed reflector 114, is transmitted through moveable reflector 115, and emerges as filtered output light 230. As with any FP filter, the wavelength and the bandwidth of the filtered output light 230 depend on the effective cavity length $L_{eff}$ and the overall reflectivity of the two filter cavity reflectors. The wavelength of the filtered output light 230 can be tuned by applying a voltage which changes the displacement 112 of the MEMS moveable reflector, thereby changing the effective cavity length $L_{eff}$.

Any semiconductor or dielectric substrate (for example Si, InP, GaAs, or GaP) can be used as substrate 212. By placing an AR coating layer 215 within the optical cavity, at the interface between the part of the substrate 216 and variable air gap 111, the optical cavity of the MEMS-FP is formed. The AR coating layer at the air-substrate interface minimizes reflection from that interface, thereby improving the filter optical cavity formed between the reflectors. The total effective optical cavity length includes the part of the substrate 216, the thickness of AR coating layer 215, and air gap 111. A combination of any dielectric materials (for example $Si/SiO_2$, $Si/Al_2O_3$, $Ta_2O_5/SiO_2$, or $SiO_2/TiO_2$) can be incorporated as multilayer dielectric DBR mirrors 213 and multilayer dielectric DBR mirrors 214 to achieve high reflectivity.

The effective optical cavity length of the MEMS-FP filter is an integer multiple of half of the design wavelength. The thickness and the number of layers of the dielectric DBR mirrors depends on the design wavelength and desired reflectivity. The optical thickness of the DBR mirrors layer is typically a quarter of the design wavelength of the MEMS-FP filter.

Figure 2B:
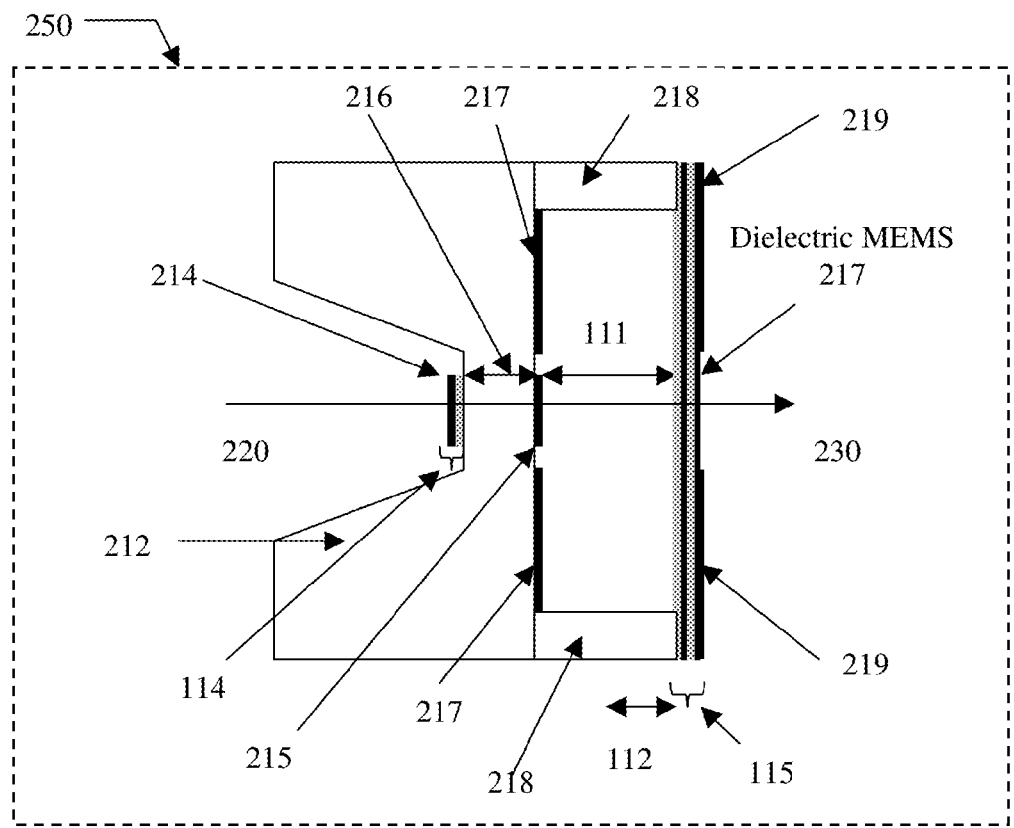

FIG. 2B shows another embodiment 250 of a MEMS-FP filter according to the invention. In this embodiment, moveable reflector 115 comprises a MEMS structure that is made up of multilayer dielectric DBR mirrors 217. In other respects, this embodiment is identical to that of FIG. 2A. In this embodiment, the optical cavity length of the MEMS-FP is given by:

$$L_{eff} = L_{pen,fixed} + n_{sub}L_{sub} + n_{AR}L_{AR} + L_{air} + L_{pen,moveable} \quad (7)$$

Figure 3A:
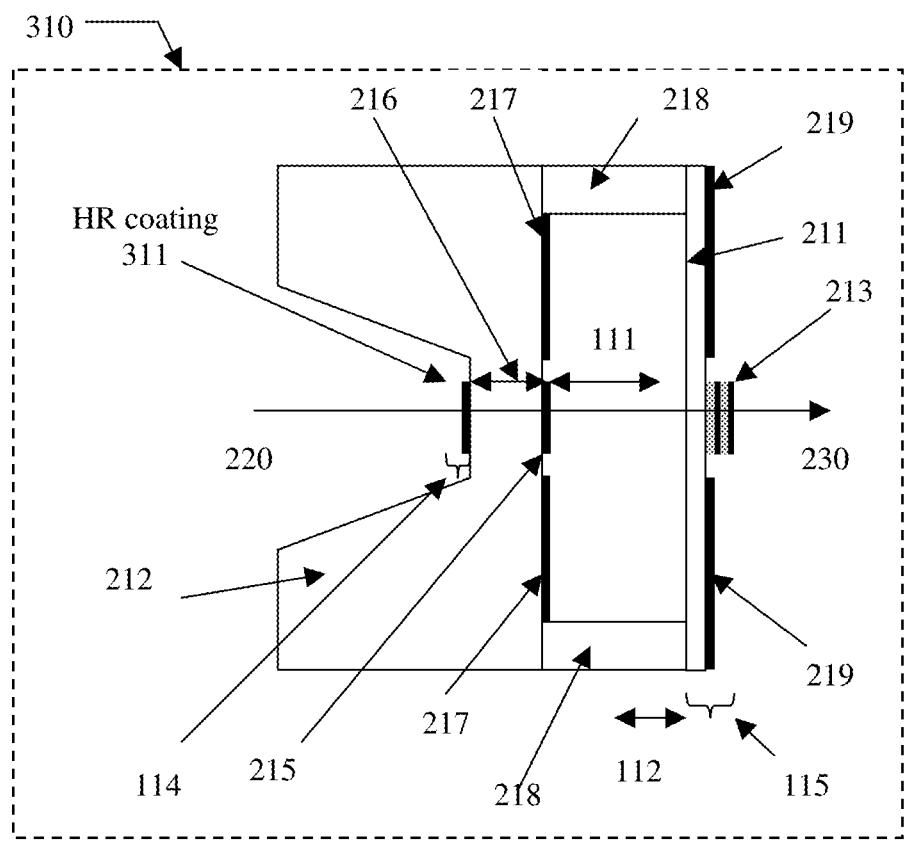
FIGS. 3A and 3B are schematic representations of dielectric mirror and HR coating based MEMS-FP filters according to two exemplary embodiments of the present invention.

FIG. 3A shows another embodiment of a MEMS-FP filter 310. In this embodiment, the fixed reflector 114 comprises a high reflective (HR) coating layer 311. The moveable reflector 115 comprises a MEMS structure 211 and multilayer dielectric DBR mirrors 213 on the MEMS structure. In this embodiment, the effective optical cavity length of the MEMS-FP is given by:

$$L_{eff} = n_{sub}L_{sub} + n_{AR}L_{AR} + L_{air} + n_{MEMS}L_{MEMS} + L_{pen,moveable} \quad (8)$$

Figure 3B:
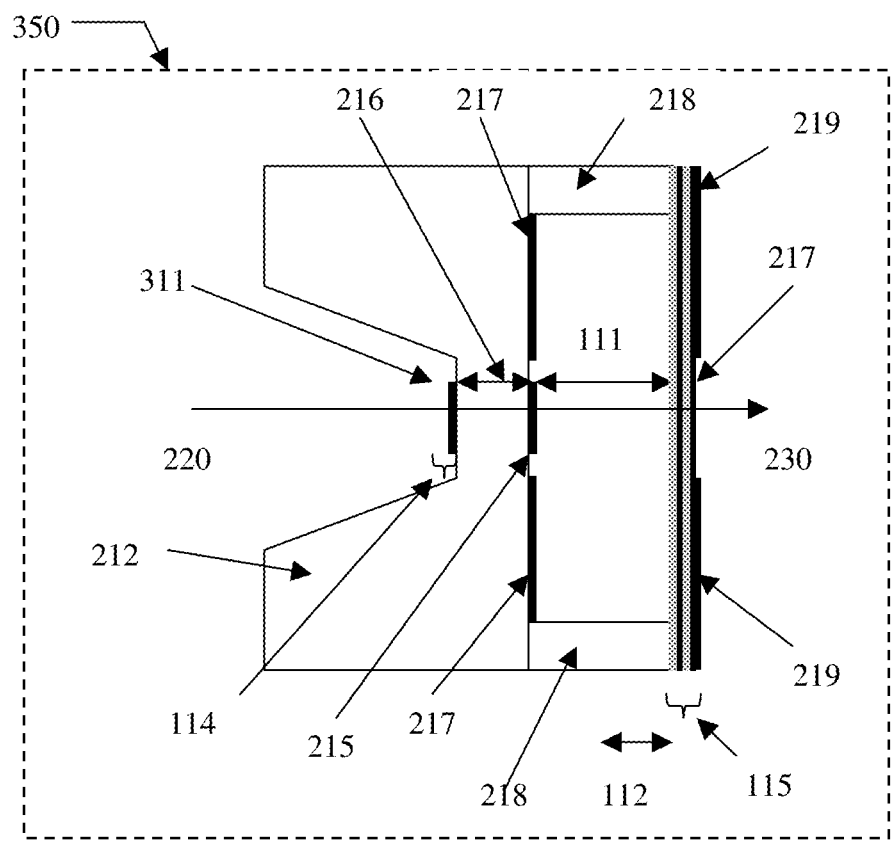

FIG. 3B shows another embodiment of a MEMS-FP filter 350. In this embodiment, the moveable reflector 115 is a MEMS structure that comprises multilayer dielectric DBR mirrors. In this embodiment, the effective optical cavity length of the MEMS-FP is given by:

$$L_{eff} = n_{sub}L_{sub} + n_{AR}L_{AR} + L_{air} + L_{pen,moveable} \quad (9)$$

The embodiments of FIGS. 3A and 3B differ from those of FIGS. 2A and 2B, respectively, in that the respective multilayer dielectric DBR mirrors of FIGS. 2A and 2B are replaced by a HR coating layer in FIGS. 3A and 3B.

Figure 4:
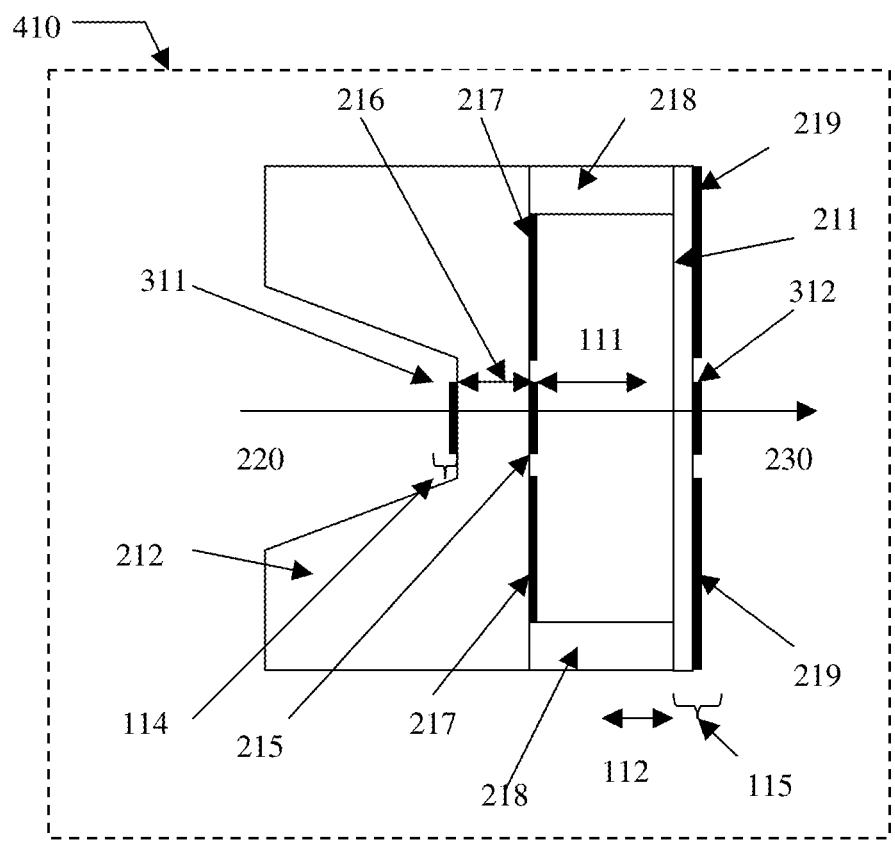
FIG. 4 is a schematic representation of an HR coating based MEMS-FP filter according to an exemplary embodiment of the present invention.

FIG. 4 shows another embodiment of a MEMS-FP filter 410. In this embodiment the fixed reflector 114 comprises a highly reflective (HR) coating layer 311. The moveable reflector 115 comprises a highly reflective (HR) coating layer 312 and MEMS structure 211. In this embodiment, the effective optical cavity length of the MEMS-FP is given by:

$$L_{eff} = n_{sub}L_{sub} + n_{AR}L_{AR} + L_{air} + L_{MEMS}L_{MEMS} \quad (9)$$

Figure 5:
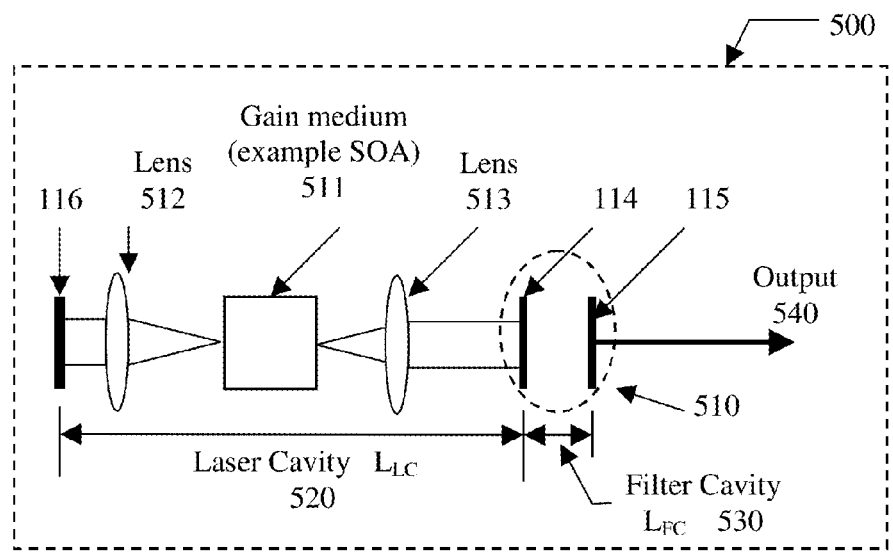
FIG. 5 is a schematic of a tunable laser system configuration based on the MEMS-FP filter of the present invention.

FIG. 5 shows a schematic of an embodiment of a tunable laser source 500 based on the MEMS FP filter of the present invention. For example, any of the MEMS FP filters of FIGS. 2A, 2B, 3A, 3B, and 4 could be item 510 in FIG. 5. The tunable laser 500 comprises a laser cavity 520 and a filter cavity 530 for wavelength selection. The linear laser cavity consists of a reflector 116, a gain medium such as a Semiconductor Optical Amplifier (SOA) 511, a lens 512, another lens 513, and a reflector 114. The filter cavity consists of the fixed reflector 114 and moveable reflector 115, which together form the Fabry-Perot (FP) cavity 530. The filter cavity length $L_{FC}$ 530 is much shorter than the laser cavity length $L_{LC}$ 520. Typically the filter cavity should be in the range of 5 to 20 µm long, whereas the laser cavity is typically in the mm range, for example 20 mm or larger. The wavelength can be tuned by changing the FP filter cavity length 530. The tunable laser light provides an output 540 through the filter cavity moveable reflector 115.

Figure 6:
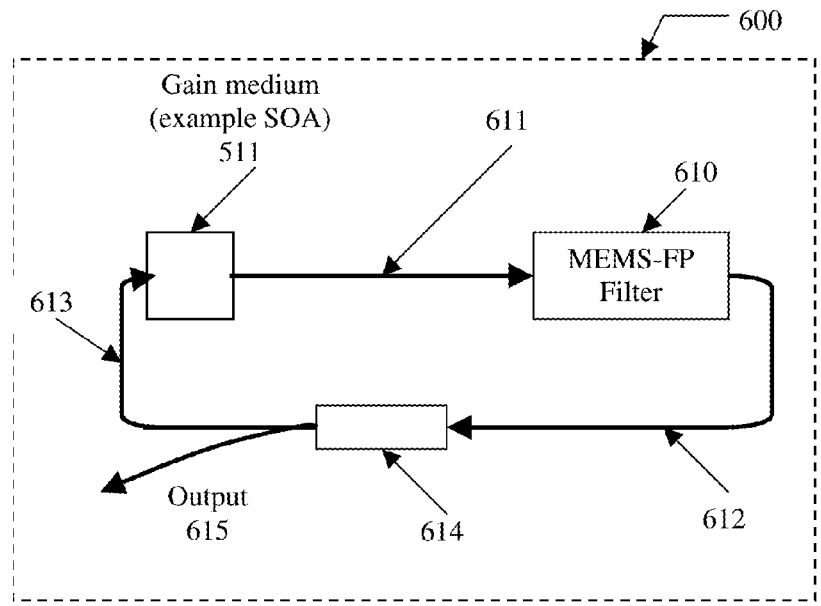
FIG. 6 is a schematic representation of a fiber coupled tunable laser system configuration based on the MEMS-FP filter of the present invention.

FIG. 6 shows a schematic of an embodiment of a tunable laser source 600 based on the MEMS FP filter of the present invention. In this embodiment a ring laser cavity comprises a gain medium (such as an SOA) 511, a first optical fiber 611, MEMS-FP filter 610 (which can be any of the MEMS-FP filters described herein, such as those in FIGS. 2A, 2B, 3A, 3B and 4), a second optical fiber 612, a 1×2 fiber optics coupler 614, which is a readily available item, and a third optical fiber 613. A dual isolator integrated gain medium or fiber optics isolator can be added to the ring cavity in order to prevent undesired back reflection. The ring laser cavity can provide filtered wavelength output 615 through the fiber optics coupler 614. Coupler 614 therefore bifurcates the light into optical fiber 613 and output 615.

Fabrication Methods

Exemplary methods of fabricating a FP filter as described herein are set forth for the embodiment of FIG. 2A. However, the fabrication processes are applicable to all embodiments by employing variations within the capability of one of skill in the art.

In the present invention, the MEMS-FP filter 210 comprises an optical cavity and a MEMS electrostatic cavity. The optical cavity is formed between the fixed reflector 114 and the movable reflector 115, and the MEMS electrostatic cavity is formed between the bottom electrode 217 and the top electrode 219. Therefore, an integrated MEMS-FP filter 210 is fabricated by using a series of deposition and etching processes. Chemical-mechanical polishing can also be used at various steps, as applicable. The moveable reflector 115 is designed to move by a driving voltage applied between the bottom electrode 217 and the top electrode 219. As a result, the optical cavity length changes and thus allows the wavelength to be tuned.

In the present invention, the MEMS electrostatic cavity is a part of the MEMS-FP filter optical cavity. The effective optical cavity length $L_{eff}$ can be configured by changing the thickness of the part of the wafer substrate 216 for a desired FSR. Similarly, the length (air gap 111) of the MEMS electrostatic cavity can be configured by changing the thickness of the sacrificial layer for a desired FSR and wavelength tuning range.

Figure 7:
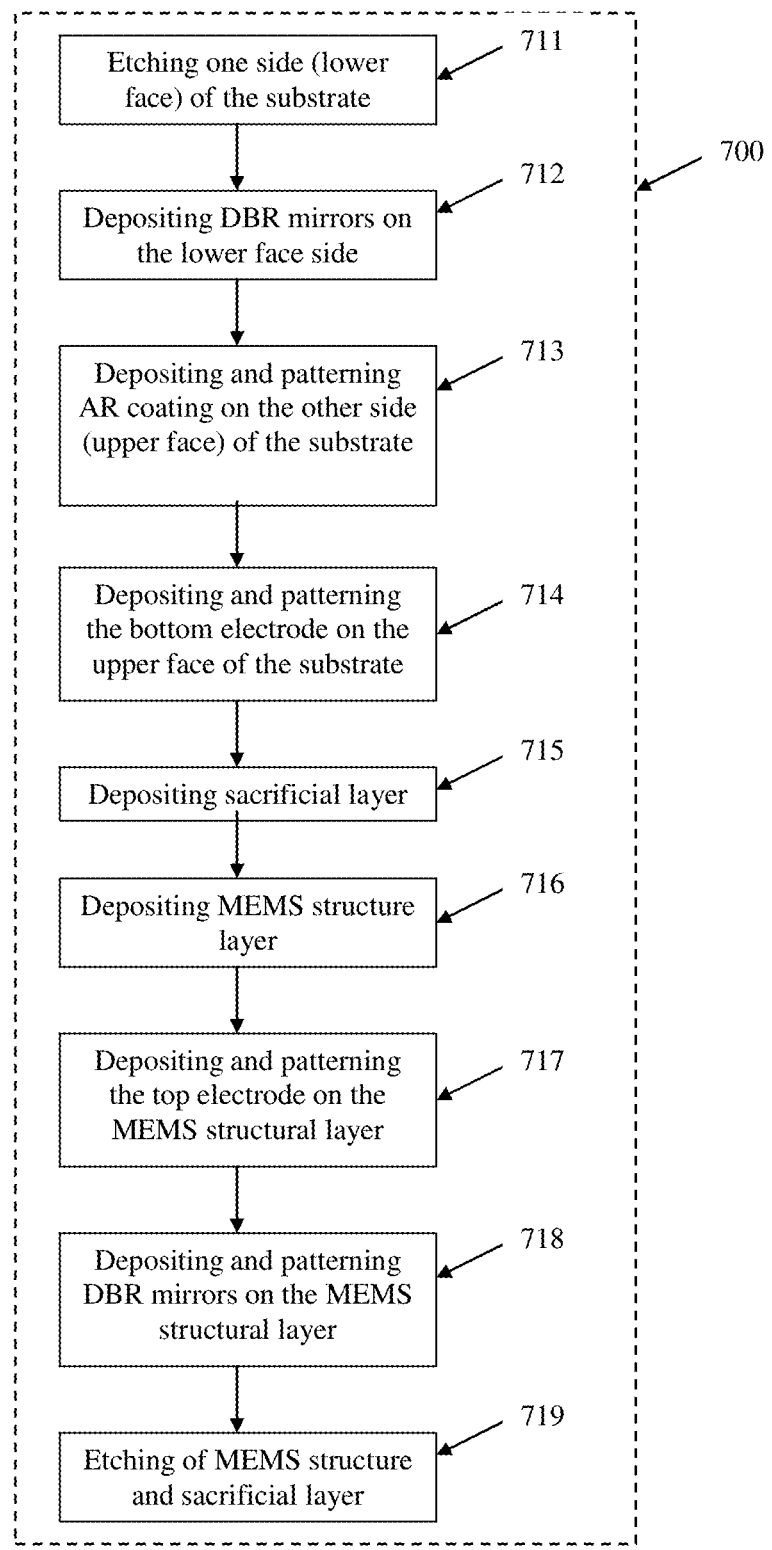
FIG. 7 is a process flow chart illustrating steps for manufacturing of a MEMS-FP filter according to the invention.

The MEMS-FP filter 210 is manufactured by a series of semiconductor fabrication processes. FIG. 7 is a flow chart 700 illustrating steps in a method for manufacturing a MEMS-FP 210 according to the invention. The first step 711 in the fabrication process is to etch one side (herein we refer to this side of the substrate as the lower face) of the substrate 212 to form a cut-out having the desired thickness of area substrate 216. Next, in step 712, the multilayer dielectric DBR mirrors 214 are then produced by depositing alternating layers of high refractive index and low refractive index material on the lower face of the wafer substrate inside the cut-out. Next, in step 713, an AR coating layer 215 is deposited on the other side (herein we refer to this side of the substrate as the upper face) of the substrate. The AR coating layer 215 is then patterned and etched with a shadow mask. Next, in step 714, a metal electrode contact layer 217 is deposited on the upper face of substrate wafer 212 and is patterned and etched with an appropriately designed shadow mask. The metal contact layer 217 acts as the bottom electrode for the MEMS structure. Next, a sacrificial layer (step 715), MEMS structure 211 (step 716) and another metal contact electrode 219 (step 717) are deposited on top of the patterned AR coating 215 and the bottom electrode contact layer 217. Subsequently, metal contact electrode 219 is patterned and etched with an appropriate shadow mask. The metal contact layer 219 acts as the top electrode for the MEMS structure. In step 718, the multilayer dielectric DBR mirrors 213 are produced by depositing alternating layers of high refractive index and low refractive index material on top of the MEMS structure 211 and the top electrode 219. Then, the multilayer dielectric DBR mirrors 213 are patterned and etched with an appropriate mask. Finally, in step 719, selective etching processes are carried out to create a functioning MEMS structure 211, to create air gap 111, and to create MEMS support frame 218. The air gap 111 and the support frame 218 are created from the sacrificial layer by the etching processes. A detailed description of these etching process can be found in G. D. Cole, E. Behymer, L. L. Goddard, and T. C. Bond, "Fabrication of suspended dielectric mirror structures via xenon difluoride etching of an amorphous germanium sacrificial layer," *J. of Vacuum Science and Technology B*, vol. 26, no. 2, pp. 593-597, March/April 2008, which is incorporated herein by reference.

The foregoing description is intended to illustrate various aspects of the instant technology. It is not intended that the examples presented herein limit the scope of the appended claims. The invention now being fully described, it will be apparent to one of ordinary skill in the art that many changes and modifications can be made thereto without departing from the spirit or scope of the appended claims.

What is claimed is:

1. A method of fabricating a MEMS-FP filter, the method comprising:
    etching a cut-out from a lower surface of a transparent substrate having a lower surface and an upper surface;
    depositing one or more multilayer dielectric DBR mirrors on to the cut-out;
    depositing an anti-reflective coating layer on to an upper surface of the transparent substrate;
    patterning and etching the anti-reflective coating layer;
    depositing a bottom electrode onto the upper surface of the transparent substrate;
    patterning and etching the bottom electrode;
    depositing a sacrificial layer, a MEMS structure, and a top electrode on top of the anti-reflective coating layer and the bottom electrode;
    patterning and etching the top electrode;
    depositing one or more multilayer dielectric DBR mirrors on to the MEMS structure;
    patterning and etching the multilayer dielectric DBR mirrors on the MEMS structure; and
    selectively etching the MEMS structure and the sacrificial layer to create an air gap and a support frame that connects the transparent substrate to the MEMS structure, wherein:
    the cut-out defines a first portion of the transparent substrate having a smaller thickness than a second portion of the transparent substrate, and
    the smaller thickness can be varied during the etching in order to provide a variation in a free spectral range of the MEMS-FP filter.

2. A MEMS-FP filter having a MEMS cavity that obtained per the method of claim 1.

3. The method of claim 1, wherein the transparent substrate is a dielectric or semiconductor material that is transparent to light in a wavelength range 100-3000 nm.

4. The method of claim 1, wherein the transparent substrate is a dielectric or semiconductor material that is transparent to light in a wavelength range 600-1800 nm.

* * * * *